US008643515B2

(12) United States Patent
Cideciyan

(10) Patent No.: US 8,643,515 B2
(45) Date of Patent: Feb. 4, 2014

(54) COMPRESSING DATA USING AN ENCODING TABLE

(71) Applicant: International Business Machines Corporation, Armonk, NY (US)

(72) Inventor: Roy D. Cideciyan, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/644,704

(22) Filed: Oct. 4, 2012

(65) Prior Publication Data

US 2013/0106627 A1 May 2, 2013

(30) Foreign Application Priority Data

Oct. 28, 2011 (EP) .................................... 11187123

(51) Int. Cl.
*H03M 7/40* (2006.01)

(52) U.S. Cl.
USPC ............................................... 341/65; 341/87

(58) Field of Classification Search
USPC ......... 341/65, 87; 708/203; 709/247; 710/68; 375/240.28
See application file for complete search history.

(56) References Cited

U.S. PATENT DOCUMENTS

2013/0018932 A1* 1/2013 Bhaskar et al. ............... 708/203

OTHER PUBLICATIONS

ECMA,"Adaptive Lossless Data Compression Algorithm," Standardizing Information and Communication Systems, ECMA-222, Jun. 1995, pp. 1-24.
ECMA, "Streaming Lossless Data Compression Algorithm—(SLDC)," Standardizing Information and Communication Systems, Standard ECMA-321, Jun. 2001, pp. 1-20.

* cited by examiner

*Primary Examiner* — Joseph Lauture
(74) *Attorney, Agent, or Firm* — Cantor Colburn LLP

(57) ABSTRACT

A method for compressing a data stream includes transforming a data stream into a transformed data stream of referencing symbols and other data elements, the referencing symbols representing a data sequence identical to a data sequence in a reference data block; and encoding the referencing symbols by replacing them with codewords according to an encoding scheme, the transformed stream includes at least one control symbol indicating a change between a portion of the transformed data stream containing a sequence of the other data elements and a portion of the transformed data stream containing a sequence of the codewords for the referencing symbols, the location of the control symbol within the transformed data stream defines the end of the respective portion of the transformed data stream, the encoding scheme providing at least one codeword associated to one of the referencing symbols is longer than a codeword representing the control symbol.

14 Claims, 4 Drawing Sheets

Start
Input N-value histogram $H_0$ — S1
$i = 1$ and $d_1 = c_1$ — S2
Extend $H_0$ with frequency $d_i$ to obtain new (N+1)-value histogram $H_i = [H_0\ d_i]$ — S3
Construct (N+1)-symbol source code $C_i$ with symbol probabilities $H_i$ / sum($H_i$) — S4
Compute A = length($C_i$(N+1)) — S5
A = K ? — S6
No: A < K — S8: $d_{i+1} = d_i - c_2$
No: A > K — S7: $d_{i+1} = d_i + c_2$
Yes — Stop
$i = i+1$ — S9

COMPRESSING DATA USING AN ENCODING TABLE

PRIORITY

This application claims priority to European Patent Application No. 11187123.2, filed 28 Oct. 2011, and all the benefits accruing therefrom under 35 U.S.C. §119, the contents of which in its entirety are herein incorporated by reference.

BACKGROUND

The present disclosure relates to data compression using data transformation, such as Lempel-Ziv transformation, and encoding. Furthermore, the present disclosure relates to methods for generating an encoding table for symbols obtained by data transformation.

Safeguarding important data is usually performed by a data backup. To keep a historical representation of the backups, the data is generally backed up on removable data storage items, such as tape cartridges or the like. Usually, data backed up onto a storage medium needs to be compressed to save backup time and storage medium capacity.

Data compression is applied in various fields of information technology. For example, data compression is often applied for permanently storing data on a tape drive or the like. There is one standard established that is defined for tape drives, the so-called Linear Tape Open (LTO) standard, which provides a hardware compression scheme consisting of a Lempel-Ziv front end and a variable-length encoder back end. The back end encoder generates variable-length code words that are substantially used to encode the length of the matched strings in the history buffer. The data transformation generates symbols which can be used to reconstruct the original data stream.

The Linear Tape Open standard refers to the ECMA-321 for streaming lossless data compression. According thereto, the back end encoder allows specific extension of a particular source symbol to be used as a control symbol. In particular, according to the ECMA-321 specification, the control symbol is incorporated into the compressed data scheme to provide a command or a marker for controlling the decompression of the encrypted data stream.

In the ECMA-321 specification, the control symbol may correspond to a scheme 1 symbol, which indicates that the following data symbols are encoded according to a compression scheme. The compression scheme provides literals which correspond to unmatched data bytes and copy pointers which are an addressing representation of a data byte sequence matching a data byte sequence in a history buffer.

Furthermore, the control symbol may represent a scheme 2 symbol, which indicates that the following data sequence does not contain encoded data. The latter scheme might be useful if the data stream to be compressed has a high entropy, such that an efficient transformation to a set of copy pointers cannot be performed, i.e., after transforming the data stream to be compressed the encoded data stream would be longer than the original data sequence.

The back end encoding is usually performed as a kind of entropy encoding, wherein control symbols are encoded by maximum-length code words. According to the ECMA-321 specification, the total length of control symbols including a leading literal flag is 13 bits.

As the history buffer size tends to become larger in order to increase the compression ratio, efficient encoding of matched data streams in the history buffer requires variable-length code words that are longer than the control symbols. However, to provide a downward compatibility there is a need to keep the same control symbols that have been used up to now in devices applying data compression according to the ECMA-321 specification. Therefore, there is a need for designing compression schemes that incorporate control symbols of a given length.

SUMMARY

In one embodiment, a method for compressing a data stream includes transforming, with a transformation front end block of a data compressor, a data stream into a transformed data stream of referencing symbols and other data elements, the referencing symbols representing a data sequence in the data stream which is identical to a data sequence in a reference data block and being pointers to the identical data sequence in the reference data block; and encoding, with an encoding end block of the data compressor, the referencing symbols by replacing them with codewords according to an encoding scheme; wherein the transformed stream includes at least one control symbol indicating a change between a portion of the transformed data stream containing a sequence of the other data elements and a portion of the transformed data stream containing a sequence of the codewords for the referencing symbols, wherein the location of the control symbol within the transformed data stream defines the end of the respective portion of the transformed data stream; and wherein the encoding scheme provides that at least one codeword associated to one of the referencing symbols is longer than a codeword representing the control symbol.

In another embodiment, a device for compressing a data stream, includes a transformation front end block configured to transform a data stream into a transformed data stream of referencing symbols and other data elements, the referencing symbols representing a data sequence in the data stream which is identical to a data sequence in a reference data block and being pointers to the identical data sequence in the reference data block; and an encoding back end block configured to encode the referencing symbols by replacing them with codewords according to an encoding scheme; wherein the transformed stream includes at least one control symbol indicating a change between a portion of the transformed data stream containing a sequence of the other data elements and a portion of the transformed data stream containing a sequence of the codewords replacing the referencing symbols, wherein the location of the at least one control symbol within the transformed data stream defines the end of the respective portion of the transformed data stream; and wherein the encoding back end block is configured such that the encoding scheme provides that at least one codeword associated to one of the referencing symbols is longer than the codeword associated to the control symbol.

In another embodiment, a method is disclosed for generating a representation of an encoding scheme for use in the compression of a data stream into a compressed data stream, wherein the encoding scheme associates codewords to each of one or more referencing symbols and to at least one control symbol, wherein each referencing symbol indicates a replaced data sequence in the compressed data stream and wherein the control symbols indicate a change between the referencing symbols and other data elements in the compressed data stream. The representation of the encoding scheme is generated by providing a set of the occurrence frequencies of each of the referencing symbols; adding a freely selected frequency to the set of the occurrence frequencies associated with the control symbol; forming the encoding scheme using a Huffman encoding algorithm, so that to each referencing symbol a codeword is associated according to its frequency of occurrence; and iteratively adapting the frequency of occurrence of the control symbol until the codeword associated to the control symbol has a desired length.

BRIEF DESCRIPTION OF THE SEVERAL VIEWS OF THE DRAWINGS

Embodiments of the present disclosure are described in more detail in conjunction with the accompanying drawings, in which.

DETAILED DESCRIPTION

LTO tape drives are well known in the art. The LTO hardware may be a peripheral equipment to be interfaced with a computer system. The hardware comprises a drive unit for receiving a tape cartridge to which data is archived or backed up or from which stored data is retrieved. Furthermore, control electronics are implemented in the tape drive to process the data stream that is provided by the computer system to be backed up and/or to process the data stream retrieved from the tape cartridge to be delivered to the computer system.

Figure 1:
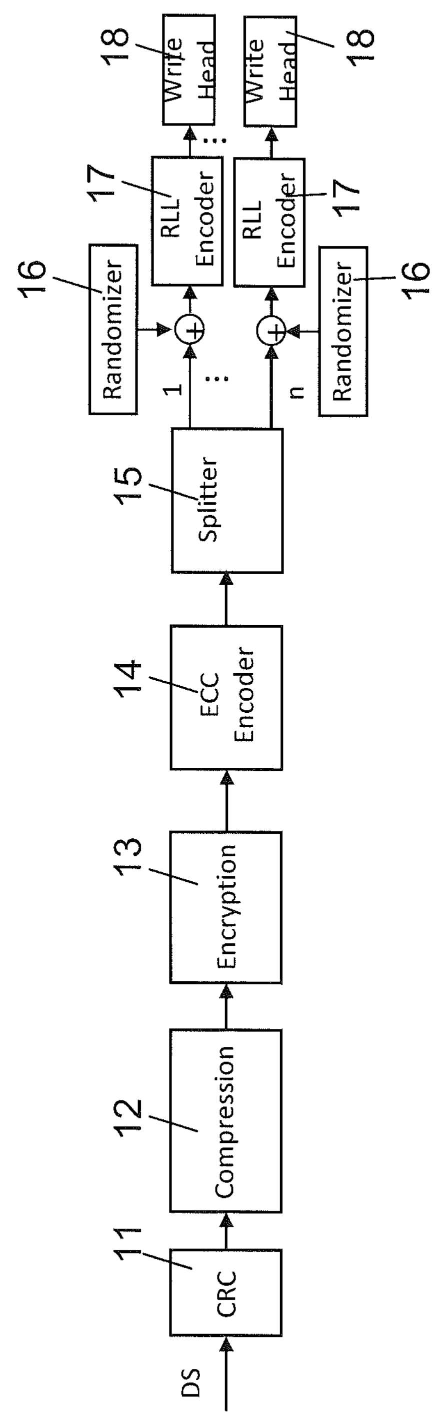
FIG. 1 shows a block diagram of a circuit for processing a data flow in LTO and enterprise tape drives.

FIG. 1 shows a schematic diagram representing a data flow in a LTO tape drive. Data to be backed up is provided as a stream of data records DS (data stream) by the computer system and is supplied to a CRC recorder 11 which serves for performing a cyclic redundancy check of each record of the data stream. Thereafter, the data is provided to a data compressor 12 which applies a data compression on the data stream coming from the CRC recorder 11, as will be explained later.

The compressed data stream is then delivered to a data encrypter 13 which employs an appropriate encryption, for example block encryption such as a Galois Counter Mode (GCM) encryption algorithm or the like. Subsequently, the encrypted data stream is supplied to an ECC (error correcting code) data encoder 14 which serves for adding error correction bits to data records of the data stream. The data stream is then split in n sub-streams in a splitter 15, wherein the number of sub-streams corresponds to the number of simultaneously written tracks on the tape. The sub-streams are then randomized by means of randomizers 16 and RLL (run length-limited) encoded in RLL encoders 17. RLL is a line coding technique for transmitting arbitrary data over a communication channel. RLL bounds the length of sequences of repeated bits during which the signal does not change due to a limited clock recovery. The data sub-streams thus processed are then provided to respective write heads 18 of the tape drive to simultaneously write the n tracks onto the tape in the tape cartridge.

For reading back data from the tape, the sub-streams are simultaneously read and the combined data stream is processed inversely to the data flow scheme for writing data onto the tape as described above.

The efficiency with respect to time and storage consumption is mainly affected by the efficiency of compression, i.e., the compression ratio. The compression ratio is the ratio of the length of the incoming data stream and the length of the compressed data stream.

Figure 2:
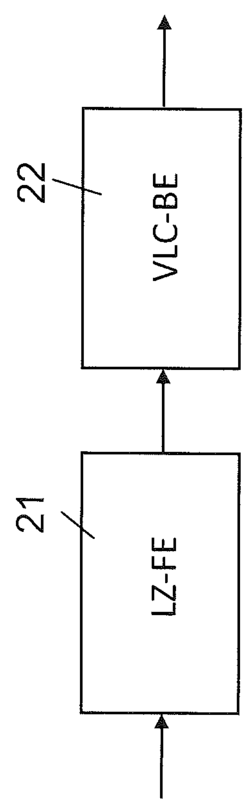
FIG. 2 shows a block diagram of a device for compressing a data stream comprising a transformation front end block and an encoding back end block.

According to the LTO specification, compressing the data stream shall conform to the standard ECMA-222 (June 1995), titled "Adaptive Lossless Data Compression Algorithm", and the standard ECMA-321 (June 2001), titled "Streaming Lossless Data Compression Algorithm". As illustrated in FIG. 2, the compression algorithm described therein consists of two substantial steps which may be performed by means of a transformation front end block 21, such as a Lempel-Ziv front end block, and an encoding back end block 22, such as a variable-length code back end block.

The transformation front end block 21 substantially serves for replacing data sequences in the data stream with referencing symbols as possible. Referencing symbols are also referred to as copy pointers and are eventually represented as codewords in the compressed data stream. The data sequences are replaced when an identical match of the data sequence can be found in a preceding part of the data stream, which may be temporarily held in a history buffer. The referencing symbol has a format that indicates the position of the identical data sequence in the history buffer with respect to a current pointer marking the start of the matched data sequence. The referencing symbol further indicates the length of the matched data sequence and the byte following the matched data sequence. According to the Lempel-Ziv 77 standard referred to in ECMA-222, a symbol has a format of <d, l, s>, where "d" represents the displacement, "l" represents the length of the matched sequence and "s" represents the byte following the matched data sequence.

The transformation process performed in the transformation front end block 21 uses a history buffer of a predetermined size. The size of the history buffer used to be 1 kB, but will be increased to 16 kB in the near future. The history buffer stores a moving frame which follows a current pointer pointing to the first byte of the data sequence to be matched. The current pointer is moved forward/downstream every time a data sequence matching process has been completed. The maximum length of a data sequence a copy pointer can refer to is 271 bytes. After a matching data sequence of 271 bytes has been found, a copy pointer is generated and the sequence matching process is restarted beginning with the next byte.

In case the data sequence matching does reveal one or more matched data sequences with a low number of repeated bytes, the above format of triples provides an inefficiency caused by the fact that the obtained set of referencing symbols is represented by codewords that could actually be longer than the matched data sequences they were replacing. In the Lempel-Ziv-Storer-Szymanski compression scheme as referred to in ECMA-321, a replacement of a data sequence with a referencing symbol is omitted if a length of a codeword representation of the matched data sequence is less than a break even length, i. e. a minimum compressible length of a data sequence. To differentiate between referencing symbols and uncompressed bytes, the Lempel-Ziv-Storer-Szymanski compression uses one-bit leading literal flags for each symbol and each byte to indicate whether the next chunk of data is a literal, i.e., an uncompressed byte, or a reference symbol indicating an offset/length pair. The break even length corresponds to the length of the uncompressed bytes including the literal flags.

According to the ECMA-321 standard, all copy pointers are encoded by the literal "1", which is a bit "1", added as a leading bit to the codeword representation of the copy pointer, wherein a literal 0, which is a bit "0", is added as a leading bit to the data byte, thereby indicating that the byte following the literal 0 represents an uncompressed byte.

In other words, with data byte sequences of short lengths, the above non-compressing encoding results in a 9-bit representation in the encoded data stream for every data byte. This might result in an encoded data stream that has 12.5% more bits than the original data stream. In order to reduce this data expansion, a new mode may be introduced which is, according to the ECMA-321 standard, called scheme 2 encoding, while the above-described generation of copy pointers is called scheme 1 encoding. The scheme 2 encoding provides that the data bytes are copied to the output bit stream without any leading literal flag bits.

In order for a decoder to distinguish a group of uncompressed/unencoded data bytes (according to scheme 2) from the representation of one or more control symbols, a control symbol is defined which corresponds to a predefined codeword. For random data this tends to produce an encoded data stream that has about 0.05% more bits than the original data stream. Hence, the control symbol indicates that the following data byte in the encoded stream represents a portion of the original sequence of data bytes of the data stream where the data bytes are not encoded.

To end the scheme 2 encoding and/or to switch to the scheme 1 encoding, another control symbol may be provided. According to the ECMA-222 standard, the symbols are encoded with a predetermined match count field which is a table that associates the symbols according to the length of the match. The table as defined by the ECMA-222 standard is illustrated in the following Table 1. It can be seen that the length of the bit code increases depending on the length of the matched byte sequence, while according to the probability of existing matched patterns a short bit code represents a short data byte sequence; with increasing length of the data byte sequence, the length of the bit code also increases.

TABLE 1

Encoding table according to ECMA-321

| Length of matched data sequence | Codeword representation |
|---|---|
| 2 | 0 0 |
| 3 | 0 1 |
| 4 | 1 0 0 0 |
| 5 | 1 0 0 1 |
| 6 | 1 0 1 0 |
| 7 | 1 0 1 1 |
| 8 | 1 1 0 0 0 0 |
| 9 | 1 1 0 0 0 1 |
| . | . |
| . | . |
| . | . |
| 15 | 1 1 0 1 1 1 |
| 16 | 1 1 1 0 0 0 0 0 |
| 17 | 1 1 1 0 0 0 0 1 |
| . | . |
| . | . |
| . | . |
| 31 | 1 1 1 0 1 1 1 1 |
| 32 | 1 1 1 1 0 0 0 0 0 0 0 0 |
| 33 | 1 1 1 1 0 0 0 0 0 0 0 1 |
| . | . |
| . | . |
| . | . |
| 270 | 1 1 1 1 1 1 1 0 1 1 1 0 |
| 271 | 1 1 1 1 1 1 1 0 1 1 1 1 |
| Control symbol | 1 1 1 1 1 1 1 1 0 0 0 0-<br>1 1 1 1 1 1 1 1 1 1 1 1 |

According to the ECMA-321 standard, which focuses on the scheme switching between scheme 1 and scheme 2 as explained above, the control symbols are predefined and are encoded as fixed codewords having the same length as the codewords for encoding a data byte sequence of 271 bytes. According to the ECMA standard, the maximum length of the codewords is 12 plus a leading bit of the literal flag (literal "1") indicating that the following codeword represent a copy pointer or a control symbol, respectively. The encoding table is designed such that the leading part of the codeword is unique, thereby clearly indicating the overall length of the respective codeword, such that no misinterpretation can occur and codewords can be safely discriminated.

Furthermore, for the sequence of uncompressed bytes according to scheme 2 encoding it has to be ensured that uncompressed data bytes cannot be misinterpreted as a control symbol and vice versa. As the codeword representation of the control symbol as shown above is set to consist of 13 "ones" in a row (literal 1 and 12 bit "1"), the representation of a data byte "1111 1111" in scheme 2 is "1111 1111 0", i.e., every time a byte "1111 1111" occurs in the uncompressed data stream of scheme 2 a bit "0" is attached to avoid the accidentally occurrence of a bit sequence which could be interpreted as a control symbol. So it can be avoided to indicate the length of the (scheme 2) stream of uncompressed data bytes in advance. In general, this is achieved by defining codewords and the set of allowed uncompressed data bytes so that the bit sequence of the codeword representation of the control symbols is unique over the whole encoded data stream.

However, one drawback of the predetermined encoding table is the fact that although the codeword associated with the symbols up to a length of 270 bytes of a matched pattern according to their probabilities, a codeword representing a matched data byte sequence of 271 bytes and the codewords representing the control symbol both have a length of 12 bits although their probability of occurrence is higher than, e.g., the probability of occurrence of a codeword representing a matched data byte sequence of 270 bytes. The probability of a matched data byte sequence of a length of 271 bytes is higher than the probability of a data byte sequence of 270 bytes as according to the compression scheme the maximum length of matched data byte sequences is limited to 271 bytes, such that the probability of the occurrence of a data symbol representing a matched data byte sequence length of 271 bytes corresponds to the sum of probabilities of the occurrence of data byte sequences of lengths of 271 bytes and more.

To correct this mismatch, it may be provided that either the control symbol or the copy pointer for a matched data byte sequence of 271 bytes or both are represented by codewords with a reduced length, i.e., with a length shorter than the length of the codeword representing a matched data byte sequence of 270 bytes.

To better represent the probability of occurrence of data byte sequence lengths of 271 bytes and more, an encoding table is proposed as follows:

TABLE 2

Encoding table with reduced codeword size for control symbols and matched data sequence lengths of 271 bytes

| Length of matched data sequence | Codeword representation |
|---|---|
| 2 bytes-3 bytes | 0 <1 bit> (2 bits) |
| 4 bytes-5 bytes | 1 0 <1 bit> (3 bits) |
| 6 bytes-7 bytes | 1 1 0 <1 bit> (4 bits) |
| 8 bytes-9 bytes | 1 1 1 0 <1 bit> (5 bits) |
| 10 bytes-11 bytes | 1 1 1 1 0 0 <1 bit> (7 bits) |
| 12 bytes-15 bytes | 1 1 1 1 0 1 <2 bit> (8 bits) |
| 16 bytes-23 bytes | 1 1 1 1 1 0 <3 bit> (9 bits) |

TABLE 2-continued

| Encoding table with reduced codeword size for control symbols and matched data sequence lengths of 271 bytes | |
|---|---|
| Length of matched data sequence | Codeword representation |
| 271 bytes | 1 1 1 1 1 1 0 1 0 1 (10 bits) |
| 24 bytes-31 bytes | 1 1 1 1 1 1 0 0 <3 bit> (11 bits) |
| Control Symbols | 1 1 1 1 1 1 1 1 0 0 0 0-<br>1 1 1 1 1 1 1 1 1 1 1 1 (12 bits) |
| 32 bytes-47 bytes | 1 1 1 1 1 1 1 0 0 <4 bit> (13 bits) |
| 48 bytes-79 bytes | 1 1 1 1 1 1 1 0 1 <5 bit> (14 bits) |
| 80 bytes-143 bytes | 1 1 1 1 1 1 0 1 1 <6 bit> (15 bits) |
| 144 bytes-270 bytes | 1 1 1 1 1 1 0 1 0 0 <7 bit> (17 bits) |

Therein, the codeword lengths increase with the sequence length of matched data byte sequences to be represented thereby, except for the codeword representation for data byte sequences of 271 bytes or more. Data byte sequences of 271 bytes or more are represented by a 10-bits codeword while data byte sequences of lengths of 144 bytes to 270 bytes are represented by a 17-bits codeword.

Although the codeword length of the longest defined codeword is longer than proposed by the ECMA standard, namely 17 bits compared to 12 bits (without literal flag), the average codeword length for a given sample data source is shorter. For a sample data source corresponding to a Calgary Corpus (a collection of 14 text and binary data files used for comparing data compression algorithms), the average codeword length is 3,437220 bits. The average code length when using the encoding table according to the ECMA standard corresponds to 3.636128 bits. It can be seen that the average code word length may be significantly reduced by more than 1% indicating that the compression was performed more efficiently.

Furthermore, depending on the kind of data to be compressed, the encoding table may be generated by preserving control symbols of a predetermined size and predetermined bit pattern. As the control symbols are predefined in the LTO specification, they must not be redefined since existing backed up data could not be decompressed or decoded, respectively.

The encoding table may be optimized for a given data source, such as the sample data source mentioned above, i.e., a Calgary Corpus. However, other kinds of data sources may also be used as a basis for generating an encoding table.

Figure 3:
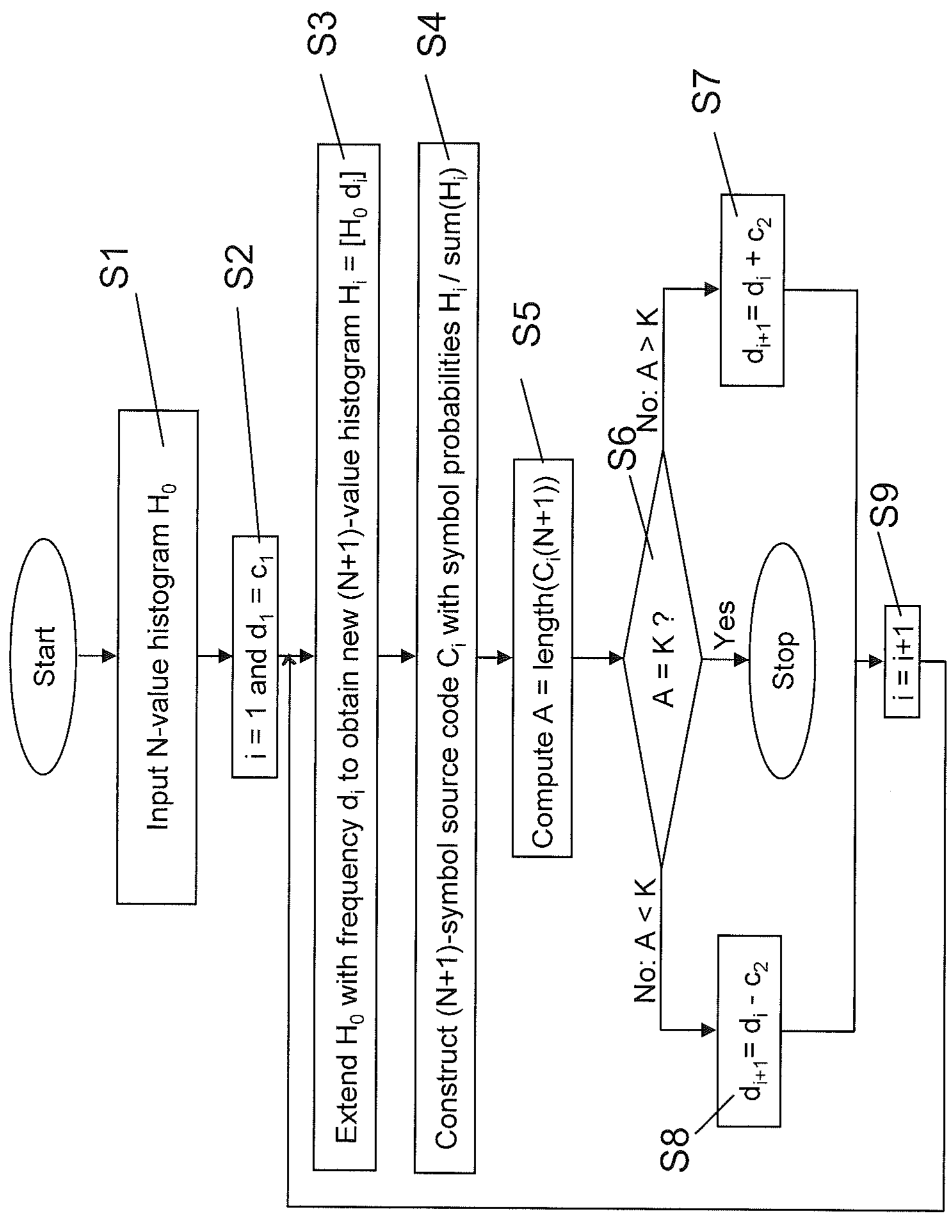
FIG. 3 shows a flow diagram for illustrating a method for generating an encoding scheme.

The flow diagram of FIG. 3 illustrates a method for generating an encoding table based on a given data source and based on the bit length of the codewords of one or more additional control symbols with a length of K bits.

As illustrated in FIG. 3, in block S1 an input histogram $H_0$ is provided or generated that represents the probabilities of data byte sequences in a given data sample.

Figure 4:
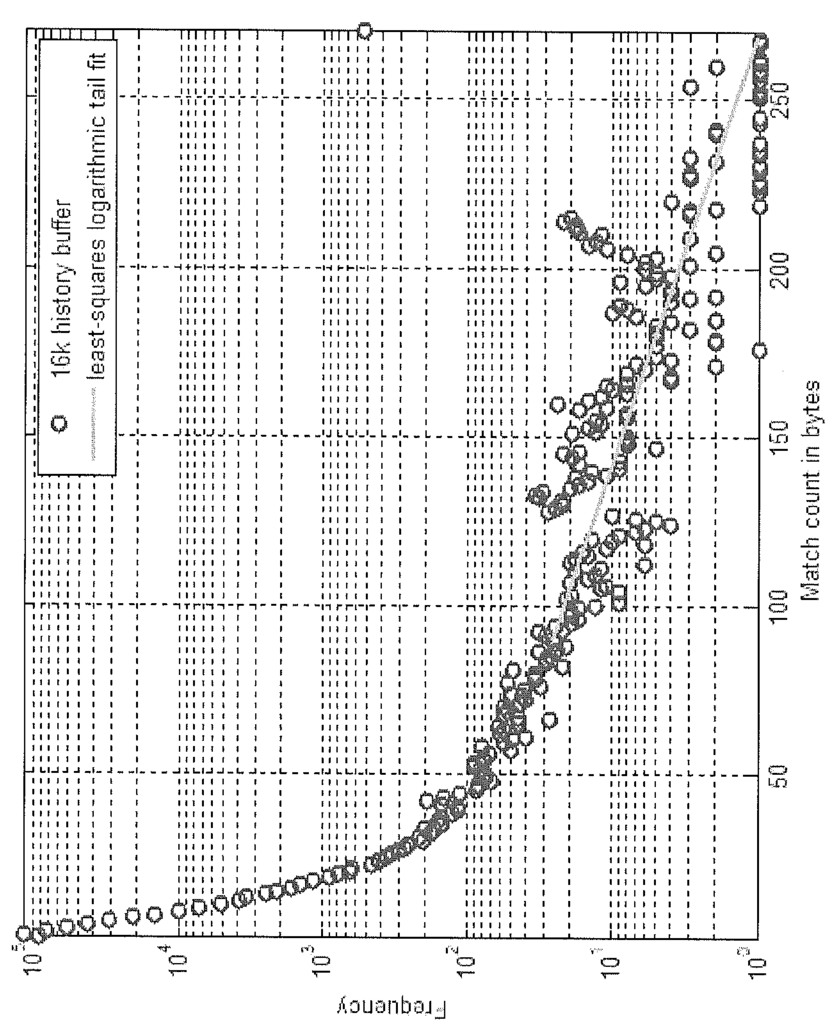
FIG. 4 shows a histogram indicating the occurrence frequencies of referencing symbols in a Calgary Corpus.

In FIG. 4, a histogram for the Calgary Corpus sample is shown. The histogram $H_0$ indicates the frequencies of N occurrences of matched data byte sequences of a given length from 2 to 271 bytes (N=270). It can be seen that the frequencies/probabilities decrease according to the grey approximation line (least-squares logarithmic tail fit), wherein the frequency of occurrence of a data byte sequence generally is the lower the longer the respective data byte sequence is. This is not true for the data byte sequence of a length of 271 bytes, the probability of which corresponds to the cumulated probabilities of occurrences of data byte sequences of lengths of 271 bytes or more.

In block S2, an iteration counter i is initially set to 1 and a variable $d_1$ is set to a first constant $c_1$, which is a positive integer and determines the speed of convergence.

In block S3, the histogram $H_0$ is extended with the frequency of a further element $d_i$ (i=1, 2, 3, . . . ) to obtain a new (N+1) value histogram $H_i=[H_0\ d_i]$. As indicated in block S4, an (N+1) symbol code $C_i$ is constructed with symbol probabilities $H_i/\text{sum}\ (H_i)$ according to a Huffman coding algorithm. A Huffman coding algorithm is an entropy encoding algorithm used for lossless data compression. The Huffman code provides a variable-length code table for encoding a source symbol, wherein the variable-length code table has been derived in a particular way based on the estimated probability of occurrence for each possible value of the source symbol.

As is generally known in the art, the Huffman algorithm works by creating a binary tree of nodes. The algorithm essentially begins with the nodes containing the probabilities of the symbol they represent, wherein a node is created whose children are those two nodes with the lowest probabilities, such that the new node probability equals the sum of the children's probabilities. With the previous two nodes merged to one node and with a new node being now considered having a next higher probability, the procedure is repeated until only one node remains and until there is no next node having a higher probability.

According to the Huffman coding algorithm, the encoding table is obtained as a representation of the tree. To obtain the codeword representation of each element (length of a matched data sequence) represented by a respective end node of the tree and its associated probability, each branch of the tree is associated with a branch bit. The closer the branch is to one of the end nodes the higher is the significance of the respective bit. Appending all branch bits on the way from the end node to the root of the tree results in the codeword which represents the respective element of the end node.

In block S5, the length A of the thus obtained codeword representing the added element $C_i$ (N+1) is computed.

In block S6, the iteration is performed. If it is determined in decision block S6 that the length A of the codeword representing the added element $C_i$ (N+1) corresponds to a desired length of the additional control symbol, which is given as K, then the encoding table of block S4 may be used as the encoding table which is optimized for the given data source and the given length of the control symbols and the process ends.

If it is determined in decision block S6 that the length A of the codeword representing the added element $A=C_i\ (N+1)>K$, then the variable $d_{i+1}$ is set to $d_{i+1}=d_i+c_2$ in block S7. $c_2$ is a second constant that is predetermined and determines the speed of convergence.

In block S9, the counter i is incremented and it is continued with block S3. If it is determined in block S6 that the length A of the codeword representing the added element $C_i\ (N+1)<K$, then the variable $d_i$ is set to $d_{i+1}=d_i-c_2$ in block S8 and the method returns to block S3 after the incrementation of the counter in block S9.

The extension of the histogram $H_0$ is performed again with the adapted element $d_i$ and the Huffman encoding table is generated again, such that an optimized encoding table may be obtained in an iterative manner. The first and second constants $c_1$ and $c_2$ should be judiciously selected. The careful selection of the constants finally determines the speed of convergence.

The above-described process of generating an encoding table is suitable to compute upper bounds on the compression of matched data sequence lengths in copy pointers using the information-theoretic measure entropy. This may be achieved by using the Huffman algorithm to obtain a Huffman encoding table for replacing the encoding table that is provided by the ECMA standard. The proposed encoding table has a 17-symbol variable-length code for matched data sequence lengths that preserves the control symbols specified in the LTO specification, such that an improvement of 1% or more in compression ratio can be achieved.

While the disclosure has been described with reference to an exemplary embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A method for compressing a data stream, the method comprising:

transforming, with a transformation front end block of a data compressor, a data stream into a transformed data stream of referencing symbols and other data elements, the referencing symbols representing a data sequence in the data stream which is identical to a data sequence in a reference data block and being pointers to the identical data sequence in the reference data block; and encoding, with an encoding end block of the data compressor, the referencing symbols by replacing them with codewords according to an encoding scheme;

wherein the transformed stream includes at least one control symbol indicating a change between a portion of the transformed data stream containing a sequence of the other data elements and a portion of the transformed data stream containing a sequence of the codewords for the referencing symbols, wherein the location of the control symbol within the transformed data stream defines the end of the respective portion of the transformed data stream; and wherein the encoding scheme provides that at least one codeword associated to one of the referencing symbols is longer than a codeword representing the control symbol.

2. The method according to claim 1, wherein the encoding scheme provides codewords for referencing symbols of data sequences up to a maximum length of the data sequences, wherein the codeword for the referencing symbol of the data sequences with the maximum length is shorter than the codeword for at least one other referencing symbol.

3. The method according to claim 2, wherein the codeword for the referencing symbol of the data sequences with the maximum length is shorter than the codeword representing the control symbol.

4. The method according to claim 1, wherein, apart from the codeword associated to the control symbol and/or from the codeword for the referencing symbol of the data sequences with the maximum length, the codewords are associated to the referencing symbols by applying a Huffman coding.

5. The method according to claim 1, wherein the other data elements correspond to one or more data elements which are not transformed.

6. The method according to claim 1, wherein the reference data block is kept in a history buffer so that the reference data block corresponds to an amount of data preceding the first element of the data sequence to be replaced.

7. A device for compressing a data stream, comprising:

a transformation front end block configured to transform a data stream into a transformed data stream of referencing symbols and other data elements, the referencing symbols representing a data sequence in the data stream which is identical to a data sequence in a reference data block and being pointers to the identical data sequence in the reference data block; and an encoding back end block configured to encode the referencing symbols by replacing them with codewords according to an encoding scheme;

wherein the transformed stream includes at least one control symbol indicating a change between a portion of the transformed data stream containing a sequence of the other data elements and a portion of the transformed data stream containing a sequence of the codewords replacing the referencing symbols, wherein the location of the at least one control symbol within the transformed data stream defines the end of the respective portion of the transformed data stream; and wherein the encoding back end block is configured such that the encoding scheme provides that at least one codeword associated to one of the referencing symbols is longer than the codeword associated to the control symbol.

8. The device according to claim 7, wherein the encoding scheme provides codewords for referencing symbols of data sequences up to a maximum length of the data sequences, wherein the codeword for the referencing symbol of the data sequences with the maximum length is shorter than the codeword for at least one other referencing symbol.

9. The device according to claim 8, wherein the codeword for the referencing symbol of the data sequences with the maximum length is shorter than the codeword representing the control symbol.

10. The device according to claim 7, wherein, apart from the codeword associated to the control symbol and/or from the codeword for the referencing symbol of the data sequences with the maximum length, the codewords are associated to the referencing symbols by applying a Huffman coding.

11. The device according to claim 7, wherein the other data elements correspond to one or more data elements which are not transformed.

12. The device according to claim 7, wherein the reference data block is kept in a history buffer so that the reference data block corresponds to an amount of data preceding the first element of the data sequence to be replaced.

13. A method for generating a representation of an encoding scheme for use in the compression of a data stream into a compressed data stream, wherein the encoding scheme associates codewords to each of one or more referencing symbols and to at least one control symbol, wherein each referencing symbol indicates a replaced data sequence in the compressed data stream and wherein the control symbols indicate a change between the referencing symbols and other data elements in the compressed data stream, wherein the representation of the encoding scheme is generated by:

providing a set of the occurrence frequencies of each of the referencing symbols;

adding a freely selected frequency to the set of the occurrence frequencies associated with the control symbol;

forming the encoding scheme using a Huffman encoding algorithm, so that to each referencing symbol a codeword is associated according to its frequency of occurrence; and iteratively adapting the frequency of occurrence of the control symbol until the codeword associated to the control symbol has a desired length.

14. The method according to claim 13, wherein the provided set of the frequencies of occurrences is derived from a Calgary Corpus data set.

* * * * *